United States Patent
Takiguchi (10) Patent No.: US 7,206,152 B2
(45) Date of Patent: Apr. 17, 2007

(54) ADAPTIVE EQUALIZING CIRCUIT AND REGENERATIVE DEVICE USING IT, AND ADAPTIVE EQUALIZING METHOD

(75) Inventor: Masafumi Takiguchi, Kanagawa (JP)

(73) Assignee: Sony Corporation, Tokyo (JP)

( * ) Notice: Subject to any disclaimer, the term of this patent is extended or adjusted under 35 U.S.C. 154(b) by 543 days.

(21) Appl. No.: 10/240,385

(22) PCT Filed: Jan. 29, 2002

(86) PCT No.: PCT/JP02/00663

§ 371 (c)(1),
(2), (4) Date: Feb. 11, 2003

(87) PCT Pub. No.: WO02/061747

PCT Pub. Date: Aug. 8, 2002

(65) Prior Publication Data

US 2003/0151842 A1   Aug. 14, 2003

(30) Foreign Application Priority Data

Jan. 29, 2001   (JP)   ................................ 2001-20134

(51) Int. Cl.
*G11B 7/00*   (2006.01)
(52) U.S. Cl. .......................................... 360/65; 360/46
(58) Field of Classification Search ................ 360/65
See application file for complete search history.

(56) References Cited

U.S. PATENT DOCUMENTS

| | | | | |
|---|---|---|---|---|
| 5,436,771 A | * | 7/1995 | Yun | ............................. 360/65 |
| 5,966,415 A | | 10/1999 | Bliss et al. | .................. 375/350 |
| 5,999,349 A | * | 12/1999 | Choi | ............................ 360/46 |
| 6,212,144 B1 | * | 4/2001 | Asano | ..................... 369/47.25 |
| 6,378,107 B1 | * | 4/2002 | Yoshinaka | ................... 714/795 |
| 2002/0009035 A1 | * | 1/2002 | Tonami | ................... 369/59.22 |
| 2002/0060596 A1 | * | 5/2002 | Shim et al. | .................. 327/307 |
| 2003/0035236 A1 | * | 2/2003 | Satoh et al. | ................... 360/65 |
| 2003/0123364 A1 | * | 7/2003 | Nakajima et al. | ......... 369/59.22 |

FOREIGN PATENT DOCUMENTS

| | | |
|---|---|---|
| EP | 0 631 414 | 12/1994 |
| EP | 1 039 463 | 9/2000 |

(Continued)

*Primary Examiner*—Wayne Young
*Assistant Examiner*—Linh T. Nguyen
(74) *Attorney, Agent, or Firm*—Frommer Lawrence & Haug LLP; William S. Frommer; Paul A. Levy (57) ABSTRACT

An adaptive type equalization circuit and a playback apparatus can be used for the playback of a digital signal. A playback signal is supplied to an analog to digital converter and phase lock loop such that digital conversion of the playback signal is performed. Characteristic information such as a detection signal from an envelope detector to which the playback signal is supplied, a signal showing a phase lock from the phase lock loop is supplied to a data generation circuit together with a playback signal from the analog to digital converter. The playback signal processed in the data generation circuit and its characteristic information are supplied to a processor such tat operation for weighting coefficients is performed. The weighting coefficients operated or calculated in the processor are supplied to a transversal filter so that adaptive equalization processing for the playback signal is performed.

16 Claims, 8 Drawing Sheets

FOREIGN PATENT DOCUMENTS

| | | |
|---|---|---|
| GB | 2 320 866 | 7/1998 |
| JP | 6-232690 | 8/1994 |
| JP | 06232690 A * | 8/1994 |
| JP | 10-275423 | 10/1998 |
| JP | 10275423 A * | 10/1998 |
| JP | 11-274986 | 10/1999 |
| JP | 11274986 A * | 10/1999 |

* cited by examiner

ADAPTIVE EQUALIZING CIRCUIT AND REGENERATIVE DEVICE USING IT, AND ADAPTIVE EQUALIZING METHOD

TECHNICAL FIELD

The present invention relates to an adaptive type equalization circuit, a playback apparatus employing the same and an adaptive equalization method which are, for example, suitable for use in the playback of a digital signal. Particularly, the present invention relates to an adaptive type equalization circuit, a playback apparatus employing the same and an adaptive equalization method in which when a playback signal is obtained or taken out from a recording medium without performing tracking control, the most suitable equalization for the characteristic of the playback signal is always performed.

BACKGROUND ART

Figure 5:
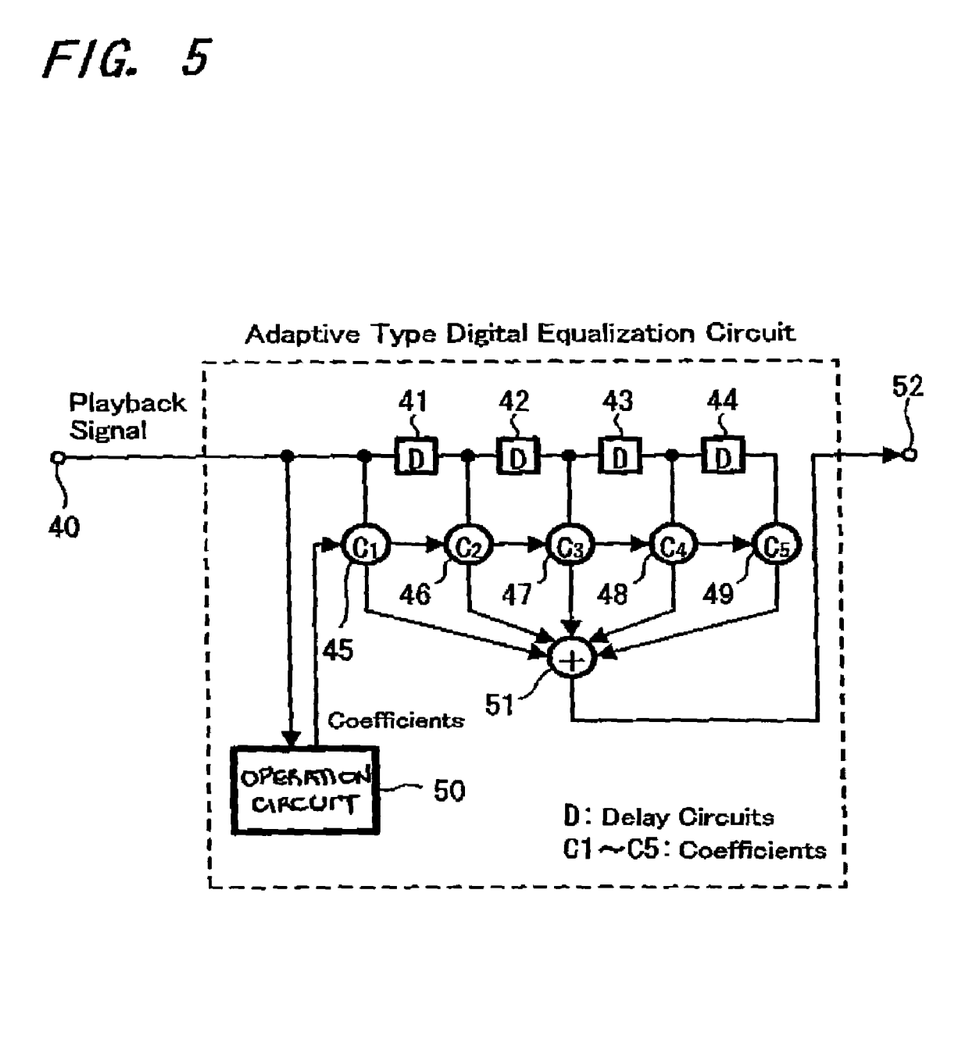
FIG. 5 is a diagram for explaining a conventional adaptive type equalization circuit.

In reproducing a digital signal, for example, an adaptive type equalization circuit is employed where an impulse response on a transmission line is estimated for equalizing a playback signal. In more detail, as this type of an adaptive type equalization circuit, for example, as shown in FIG. 5, a playback signal supplied to an input terminal 40 is supplied to a plurality of unit delay means 41 to 44 connected in series. Although the unit delay means are four stages in FIG. 5 for the purpose of simplification, more than ten stages are employed in an actual apparatus. The signals of the input terminals and the output terminals of the unit delay means 41 to 44 are supplied to weighting means 45 to 49, respectively.

The playback signal supplied to the input terminal 40 is supplied to an operation circuit 50 and weighting coefficients $C_1$ to $C_5$ are obtained by estimating an impulse response on a transmission line where LMS (Least Mean Square) algorithm, for example, is employed. The coefficients $C_1$ to $C_5$ obtained in the operation circuit 50 are supplied to the weighting means 45 to 49 and respective weightings are performed for the signals from the unit delay means 41 to 44. Further, the signals from the weighting means 45 to 49 are summed in an adder 51 so that equalization of the playback signal is performed wherein an equalized signal is obtained at an output terminal 52.

By the way in recording/reproducing a digital signal, it was devised that means for taking out a playback signal is provided, for example, without performing tracking control at the time of playback, for example, by recording while an address is added for each recording unit, and repeatedly reproducing its recording track twice or more to extract only recording units that are correctly reproduced, whereby reconstructing the playback signal according to the address. With this means, a structure for the tracking control is not necessary and it is not necessary to record a control signal on a recording medium for that control and the like, whereby recording/reproducing a digital signal can be performed with a simple structure.

Figure 6:
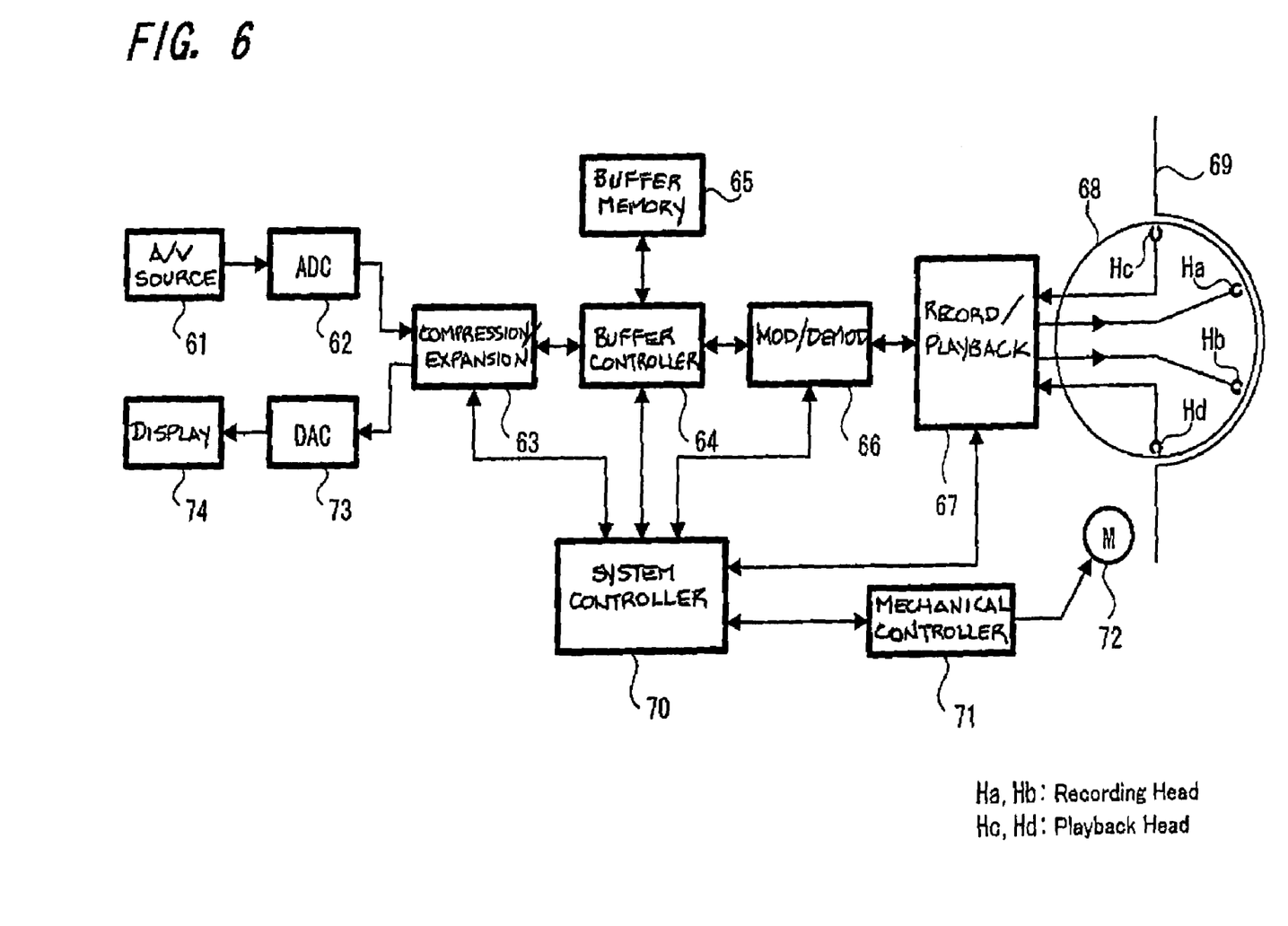
FIG. 6 is a diagram for explaining a recording/playback apparatus in which tracking control is not performed.

In FIG. 6 in more detail, analog signals from a video/audio signal source 61 of a video camera and the like are converted into digital signals in an analog to digital converter (ADC) 62 to be supplied to a compression/expansion circuit 63. A signal supplied to the compression/expansion circuit 63, a buffer controller 64, and a buffer memory 65 is compressed by a certain degree. Further, this compressed signal is supplied to a modulation/demodulation circuit 66 using error correction codes (ECC) and the modulated signal is supplied to magnetic heads Ha, Hb disposed on a rotating drum 68 via a recording/playback circuit 67.

Meanwhile a system controller 70 controlling the entire apparatus is provided such that the compression/expansion circuit 63, the buffer controller 64, the modulation/demodulation circuit 66, the recording/playback circuit 67 and the like are controlled according to a situation, respectively, and communication is performed between the system controller 70 and a mechanical controller 71 at the same time such that driving means 72 such as a motor (M), for example, which transfers a magnetic tape 69, is controlled. In this way the signal from the recording/playback circuit 67 is recorded on the magnetic tape 69 such that the signal forms a diagonal track transferred along the peripheral face of the rotating drum 68.

Figure 7A:
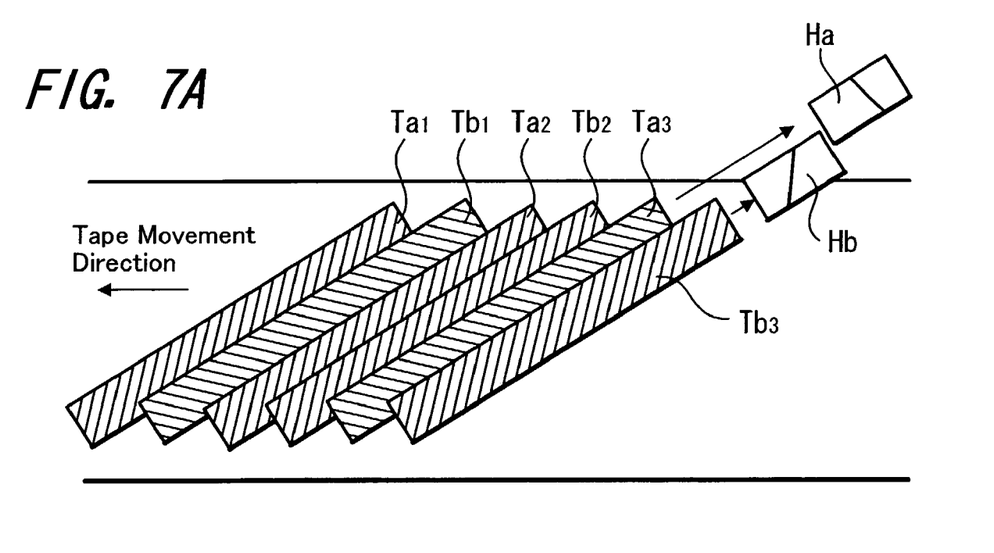
FIG. 7 shows views for explaining FIG. 6.

Further, in the magnetic heads Ha, Hb described above, for example, the azimuth angles of the respective magnetic gaps are set so as to be mutually and oppositely different from the angle perpendicular to the rotational direction of the rotating drum 68 and the magnetic head Hb is arranged so as to perform recording at a position at which the magnetic head Hb overlaps with a track recorded by the magnetic head Ha. In this way a track pattern, for example, as shown in FIG. 7A is formed on the magnetic tape 69 transferred along the peripheral face of the rotating drum 68. That is, in FIG. 7A, recording/playback in which so-called guard bands between tracks are removed is performed.

In another aspect for the magnetic heads Ha, Hb described above, the azimuth angles of the respective magnetic gaps are set so as to be mutually and oppositely different from the angle perpendicular to the rotational direction of the rotating drum 68, the magnetic head Ha is arranged so as to record the next track at a position that is two track pitches ahead of the track recorded last time and the magnetic head Hb is arranged so as to perform recording at a position that is one track pitch behind the next track recorded by the magnetic head Ha. In this way a track pattern, for example, as shown in FIG. 7B is formed on the magnetic tape 69 transferred along the peripheral face of the rotating drum 68.

Figure 7B:
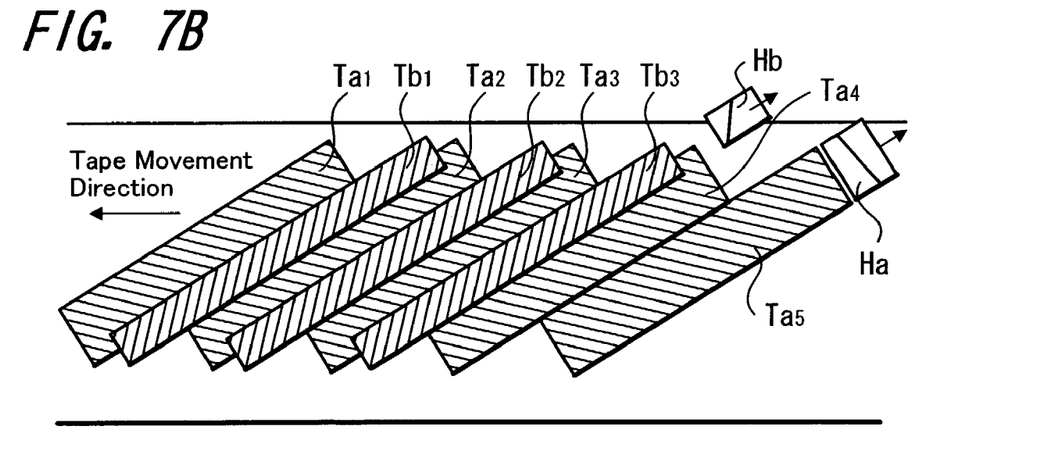
Figure 8A:
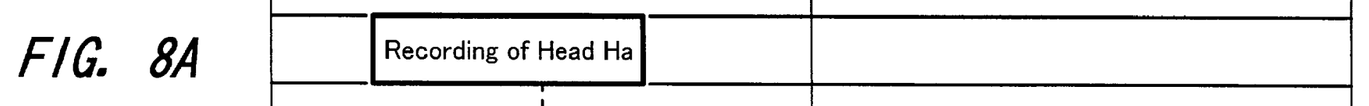
FIG. 8 shows views for explaining FIG. 7.
Figure 8B:
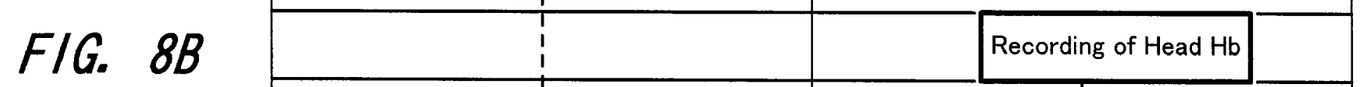
Figures 8C, 8D:
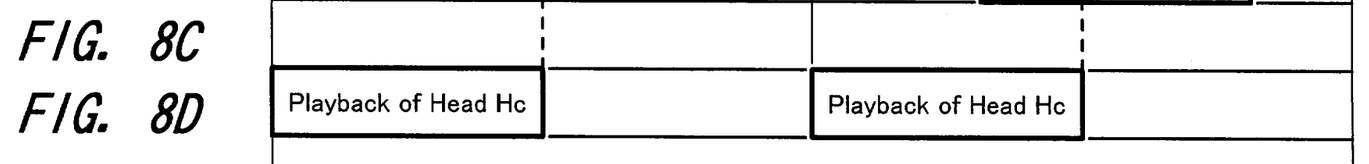
Figure 8E:
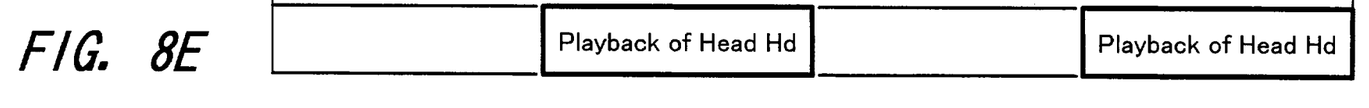

As seen in FIG. 7B, recording tracks Ta1, Ta2, . . . are first recorded every other track by the magnetic head Ha with a wide width and then on the boundary parts of those recorded tracks, recording tracks Tb1, Tb2, . . . are recorded by the magnetic head Hb. Accodingly even when pairing of the magnetic head Ha, Hb, fluctuation caused by relative positional relationship between the magnetic heads, peripheral fluctuation, fluctuation of the bearing itself or the like occurs, the intervals of the recording tracks Ta1→Tb1, Tb1→Ta2 can be always maintained at predetermined intervals and a prescribed track pattern is formed on the magnetic tape 69.

Accordingly, in any of the track patterns of FIGS. 7A, 7B, the azimuth angles of the magnetic gaps are different as described above, so that it is possible to reduce cross talk from the adjacent tracks by performing playback by the magnetic heads of the corresponding azimuth angles during the time of playback. Thus, recording/playback of a high recording density in which the so-called guard bands between tracks are removed can be performed. For such track pattern in which the guard band is removed, for example, a playback signal can be obtained without performing tracking control during the time of playback.

In more detail, in the apparatus described above, recording is performed, for example, one track each for one rotation of the rotating drum 68 by the magnetic heads Ha, Hb alternately. On the other hand, playback is performed, for example, by two tracks each for one rotation of the rotating drum 68 by magnetic heads Hc, Hd disposed on the rotating drum 68. In this way, each recording track recorded by the magnetic heads Ha, Hb is reproduced two times each by the magnetic heads Hc, Hd. Here, the magnetic heads Ha, Hb are provided at an angle rate of 45 degrees with respect to the circumference of the rotating drum 68, and the magnetic heads Hc, Hd are provided at an angle rate of 180 degrees.

Supplying a signal and taking out a signal are performed in the recording/playback circuit 67 for the magnetic heads Ha to Hd, for example, as shown in FIG. 8. Actually, for one rotation of the rotating drum 68 shown in FIG. 6, recording is performed by the magnetic heads Ha, Hb during the time of recording as shown in FIGS. 8A and 8B. On the other hand, during the time of playback, playback is performed by the magnetic heads Hc, Hd as shown in FIGS. 8D and 8E. Thus, the recording track recorded by one track each for one rotation of the rotating drum 68 is reproduced by two tacks each for one rotation of the rotating drum 68.

Accordingly, the recording track recorded by the magnetic heads Ha, Hb is reproduced two times each by the magnetic heads Hc, Hd. Then, for example, in recorded digital data, a certain address or the like is provided for each recording unit such that, for example, only the recording units which are correctly reproduced can be extracted from playback signals reproduced two times each to reconstruct digital data. There, such reconstruction of digital data can be performed, for example, by the cooperation of the buffer controller 64 and the buffer memory 65 at the same time as demodulation with error correction is performed in the ECC modulation/demodulation circuit 66.

Then, the digital data reconstructed in the modulation/demodulation circuit 66 are supplied to the compression/expansion circuit 63 such that expansion for restoring the compression performed during the time of recording is performed. Further, an expanded digital signal is converted into an analog signal in a digital to analog converter (DAC) 73 and analog signals of, for example, video and audio signals are taken out. The obtained video and audio signals are supplied to a display device 74 such as a television receiver or the like. Thus, recording and reproducing of, for example, video and audio signals by digital data are performed.

Accordingly, with the present apparatus, a track pattern of a high recording density in which the so-called guard bands between tracks are removed is formed during the time of recording and each recording track is reproduced two times each such that only a recording unit that is correctly reproduced is extracted during the time of playback whereby it is not necessary to perform the so-called tracking control especially during the time of playback. Further, by reconstructing recorded units that are correctly reproduced, for example, according to addresses, recording and reproducing digital data can be performed excellently by an extremely simple structure.

However, in such a playback apparatus in which the tracking control is not performed, a playback signal is not always maintained more than a predetermined level and when tracking is deviated, the level of the playback signal is lowered, so that it happens the signal to noise ratio (S/N) becomes extremely deteriorated. Thus, when such a playback signal is supplied, for example, to the adaptive type equalization circuit as shown in FIG. 5, for example, the operation or the like at the time of obtaining the weighting coefficients $C_1$ to $C_5$ for estimating the impulse response described above in the operation circuit 50 malfunctions due to noises and there is a fear that erroneous coefficients $C_1$ to $C_5$ of weighting are formed.

Although such malfunction due to noises also occurs in a normal playback apparatus, serious malfunction does not occur in a normal operation since noises occurred sporadically are restored by normal signals the absolute value of which is great. However, in the playback apparatus in which the tracking control is not performed as described above, it is recognized that continuous noises occur frequently based on the system and it is not possible to avoid malfunction in the adaptive type equalization circuit described above. Consequently, an adaptive type equalization circuit is considered not to be adopted in a conventional playback apparatus in which the tracking control is not performed.

Meanwhile, when the level of a playback signal temporarily decreases due to clogging of a playback head or the like, the intermediate to the high frequency range component of a playback signal decreases so that the envelope becomes small, and in such a case, if the weighting coefficients of an adaptive type equalization circuit are not changed rapidly, there is a fear that the error rate is quickly deteriorated. In another case where for example a head in which Barkhausen noise (discontinuous fluctuation in the output) occurs is employed, there is a fear that the amplitude of a playback signal frequently fluctuates. A conventional adaptive type equalization circuit cannot appropriately cope with such fluctuation.

The present application is developed considering such points and the problem to be solved is that in a conventional apparatus there is a fear that an erroneous coefficients of weighting are formed in an adaptive type equalization circuit, for example, in a case where continuous noises occurs frequently, that an appropriate countermeasure cannot be taken for a temporal decrease in the level of a playback signal and for discontinuous fluctuation in the output, and thus an adaptive type equalization circuit cannot be adopted, for example, in a playback apparatus in which tracking control is not performed.

DISCLOSURE OF THE INVENTION

The present invention can always offer an appropriate countermeasure even when continuous noises occur frequently or a temporal decrease in the level of a playback signal or discontinuous fluctuation in the output occurs where an adaptive type equalization circuit can be adopted with an excellent operation, for example, even in a playback apparatus in which tracking control is not performed. For this purpose, the present invention is directed to select a plurality of adaptive equalization programs by using characteristic information related to the input signal and to set a parameter necessary for executing the programs. Regarding such intention an adaptive type equalization circuit, a playback apparatus employing the same and an adaptive equalization method according to the present invention are disclosed.

BEST MODE FOR CARRYING OUT THE INVENTION

Figure 1:
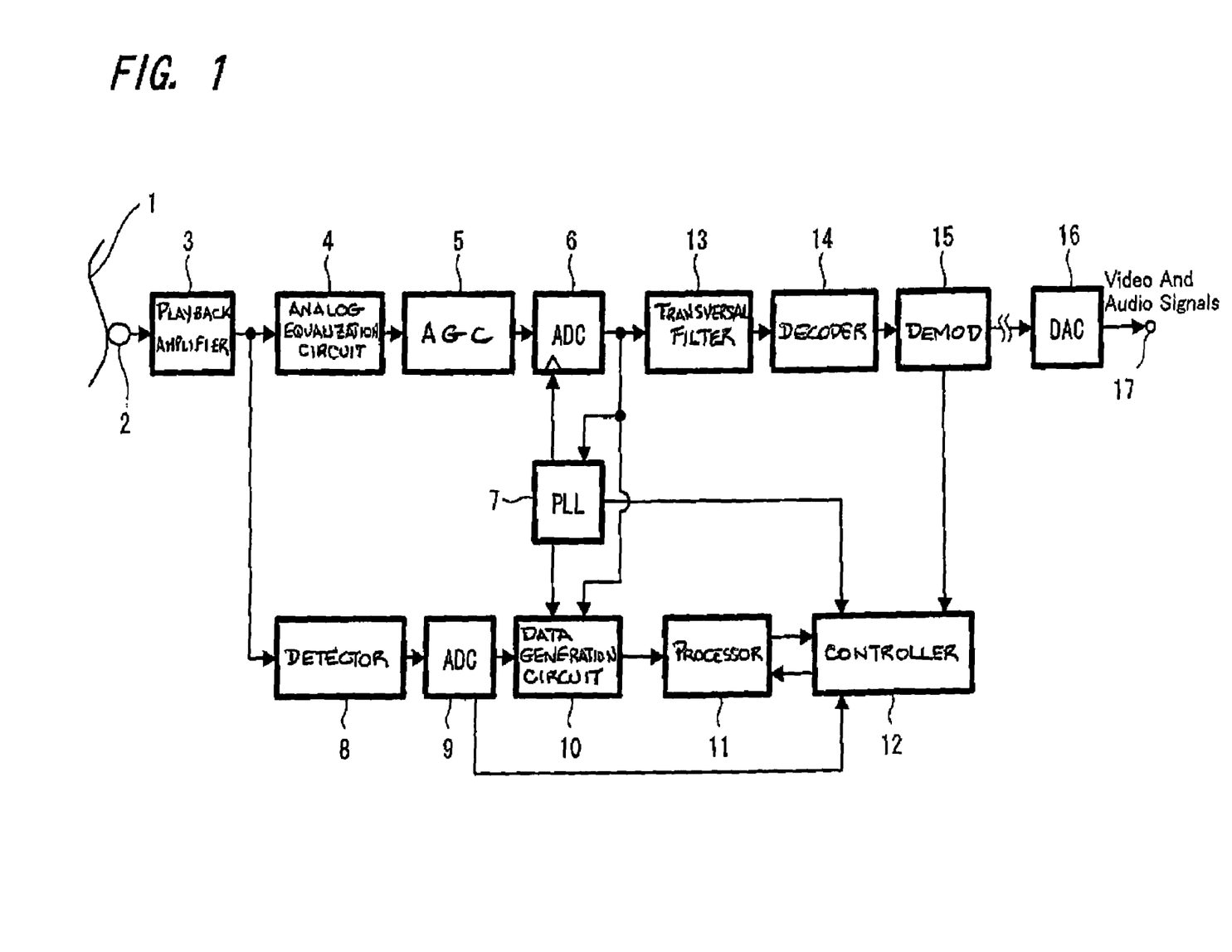
FIG. 1 is a block diagram of one embodiment of a playback apparatus to which the present invention is applied.

The present invention is explained below referring to drawings. FIG. 1 is a block diagram showing a structure of one embodiment of a playback apparatus to which the present invention is applied. In FIG. 1, the main part of the present invention is explained in detail, and other parts are omitted. However, the structures of the other parts are similar to those of the prior art shown in FIG. 6.

In FIG. 1, a playback signal reproduced by a playback head 2 from a magnetic tape 1 is supplied to a playback amplifier 3 and a signal from this playback amplifier 3 is supplied to an automatic gain control circuit 5 via an analog equalization circuit 4. The gain controlled signal is supplied to an analog to digital converter (ADC) 6. Further, the digital signal converted in this analog to digital converter 6 is supplied to phase lock loop (PLL) means 7 where a data clock of the playback signal is extracted and this extracted data clock is supplied to the converter 6 such that the digital conversion of the playback signal is performed.

The signal from the playback amplifier 3 is supplied to a detector 8 for obtaining an envelope value. The envelope value of the playback signal detected in the detector 8 is supplied to a data generation circuit 10 via an analog to digital converter (ADC) 9. A signal showing that the phase locked is supplied to the data generation circuit 10 from the phase lock loop means 7 described above. Further, the playback signal from the analog to digital converter 6 is supplied to the data generation circuit 10. Then, the playback signal processed in the data generation circuit 10 and characteristic information related to the playback signal is supplied to a processor 11.

In the processor 11, the playback signal supplied from the data generation circuit 10 and the characteristic information thereof are combined and operated to obtain weighting coefficients. Further, the processor 11 is controlled by a controller 12. By this controller 12, many variables and other details are controlled for the adaptive equalization programs which are executed in the processor 11 and, for example, a step size (loop gain) in an LMS (Least Mean Square) algorithm employed in the operation and an evaluation value of the characteristic information of a playback signal and the like can be controlled with high accuracy.

Further, the information of the envelope value of the playback signal which is detected in the detector 8 described above, the information showing that the phase is locked in the phase lock loop means 7 and, for example, the information of error detection in the playback signal are supplied to the controller 12. This information of error detection is, for example, a value corresponding to the number of error corrections performed in an error correction codes (ECC) demodulation circuit 15 described later. Based on these kinds of information, in the controller 12, selection of the adaptive equalization programs executed in the processor 11 described above and setting of a parameter necessary for executing the program are performed.

Actually a plurality of adaptive equalization programs are provided for the processor 11. Here the LMS algorithm described above is employed in general. On the other hand, for example, in a case where a very fast convergence speed is required, for example, an adaptive equalization program in which, for example, an affine projection algorithm or a block conjugate gradient algorithm and the like is used as a central or main element can be selected other than the LMS algorithm described above. These adaptive equalization programs are selected based on the information described above in the controller 12 and the selected adaptive equalization program is loaded to the processor 11 so that the weighting coefficients are operated.

In the LMS algorithm, too, although a fixed step size algorithm in which operation amount is small and the load of the processor is small is employed in general, in a case, for example, where there is a long spare time in the processor 11, a process is employed in which the step size is shortened gradually from a longer step size to expedite the convergence speed. Further, in a case, for example, where a head is employed in which Barkhausen noise (discontinuous fluctuation in the output) occurs and when the amplitude of a playback signal frequently fluctuates, it is possible to perform a process in which the step size is controlled in response to the amplitude.

The weighting coefficients operated in the processor 11 is supplied to a transversal filter 13 such that adaptive equalization processing for the playback signal supplied from the analog to digital converter 6 described above is performed. Since an actual structure of the transversal filter 13 is the same as that of the adaptive equalization circuit in FIG. 5 which was shown in the background art described above, detailed explanation thereof is omitted. Actually the portion eliminating the operation circuit 50 from the construction of FIG. 5 corresponds to the transversal filter and the weighting coefficients $C_1$ to $C_5$ operated in the processor 11 are supplied to the weighting means 45 to 49.

Further, the signal from the transversal filter 13 is supplied to a Viterbi decoder 14. In this Viterbi decoder 14, a transmission symbol series in which a path metric becomes a maximum is estimated by employing an impulse response on each transmission line which is estimated, for example, by different weighting coefficients and the transmission symbol series in which the calculated maximum value of the path metric becomes maximum is outputted. Accordingly the outputted transmission symbol series has selected an estimation coefficient of the most suitable LMS in the transversal filter 13 and thus it is possible to reduce an estimation error and correctly estimate an impulse response.

Further, a signal from the Viterbi decoder 14 is supplied, for example, to the error correction codes (ECC) demodulation circuit 15 and, for example, reconstruction of the digital data is performed at the same time as the error correction. Further, the reconstructed digital data are supplied to an expansion circuit (whose drawing is omitted) or the like and expansion for restoring the original from the compression performed during the time of recording is performed. This signal then is converted into an analog signal in an analog to digital converter (DAC) 16 so that for example analog signals of video and audio signals are taken out at an output terminal 17. Thus, for example, the digitally recorded video and audio signals are reproduced.

Figure 2:
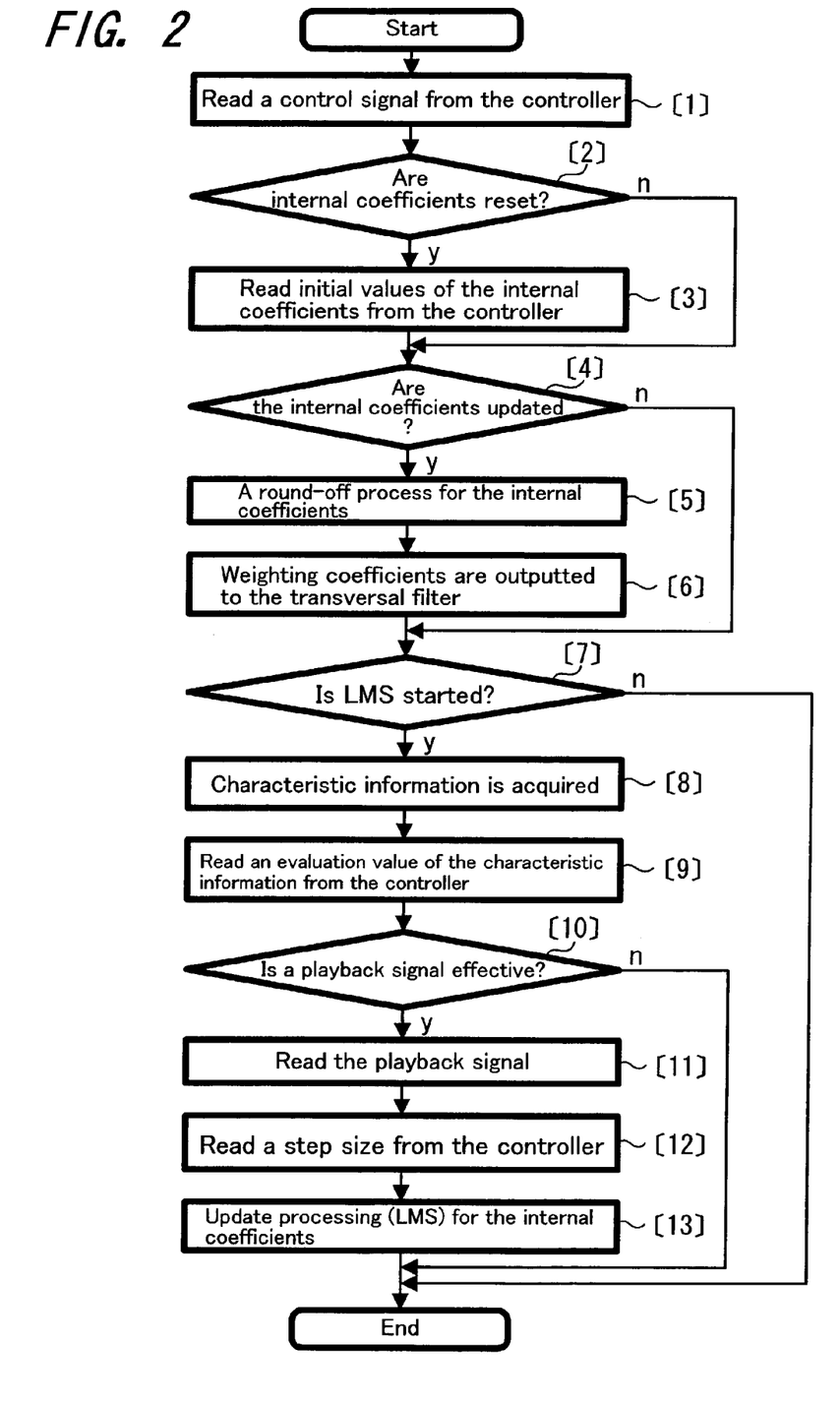
FIG. 2 is a flow chart diagram for explaining FIG. 1.

In FIG. 2, a flow chart of one embodiment of an adaptive equalization program, for example, provided in the processor 11 is shown. This flow chart is of one in which, for example, the LMS algorithm is made as a nucleus. In FIG. 2, when an operation is started, first a control signal from the controller 12 is read in step [1] and it is judged whether or not internal coefficients should be reset in step [2]. When they are made reset (yes), initial values of the internal coefficients are read from the controller 12 in step [3] and the internal coefficients are reset to the initial values.

Further, after the completion of step [3] or when the internal coefficients are not made reset (no) in step [2], it will be judged whether or not the internal coefficients were updated in step [4]. When the internal coefficients are updated (yes), a round-off process is performed for the updated internal coefficients in step [5] and the weighting coefficients $C_1$ to $C_5$ for which the round-off process was performed are outputted to the transversal filter 13 in step [6]. Thus, the weighting coefficients $C_1$ to $C_5$ of the transversal filter 13 are updated by adaptive processing.

In step [7], it is judged whether or not the LMS algorithm is started. When it is started (yes), characteristic information is acquired in step [8] and an evaluation value of the characteristic information is read from the controller 12 in step [9]. Further, it is judged whether or not a playback signal is effective in step [10]. When it is effective (yes), the playback signal is read in step [11], a step size is read from the controller 12 in step [12] and update processing for the internal coefficients, for example, by the LMS algorithm is performed in step [13].

Thus, the update processing of the internal coefficients is performed in the processor 11 and its processing completes. Also, when the algorithm is not started (no) in step [7] or when the playback signal is not effective (no) in step [10], the processing will be completed. It should be noted that this processing is repeatedly performed every predetermined period. Only when the internal coefficients are updated in step [4] in that every processing, the weighting coefficients $C_1$ to $C_5$ for which the round-off process is performed in step [5] are outputted in step [6] so that the weighting coefficients of the transversal filter 13 are updated.

Therefore, with this embodiment, since the characteristic information related to the input signal is employed for selecting a plurality of adaptive equalization programs and for setting parameters necessary for executing the program, an appropriate countermeasure can always be taken and excellent equalization can always be performed even when continuous noise frequently occurs or a temporal deterioration in the level of a playback signal or discontinuous fluctuation in the output occurs.

Thus, although an adaptive type equalization circuit could not be adopted in a conventional playback apparatus in which, for example, tracking control is not performed based on the fact that there is a fear that erroneous weighting coefficients are formed in an adaptive type equalization circuit in a case where, for example, continuous noises frequently occur and an appropriate countermeasure cannot be taken for a temporal decrease in the level of the playback signal or for discontinuous fluctuation in the output, the present invention can easily solve these problems.

Figure 3:
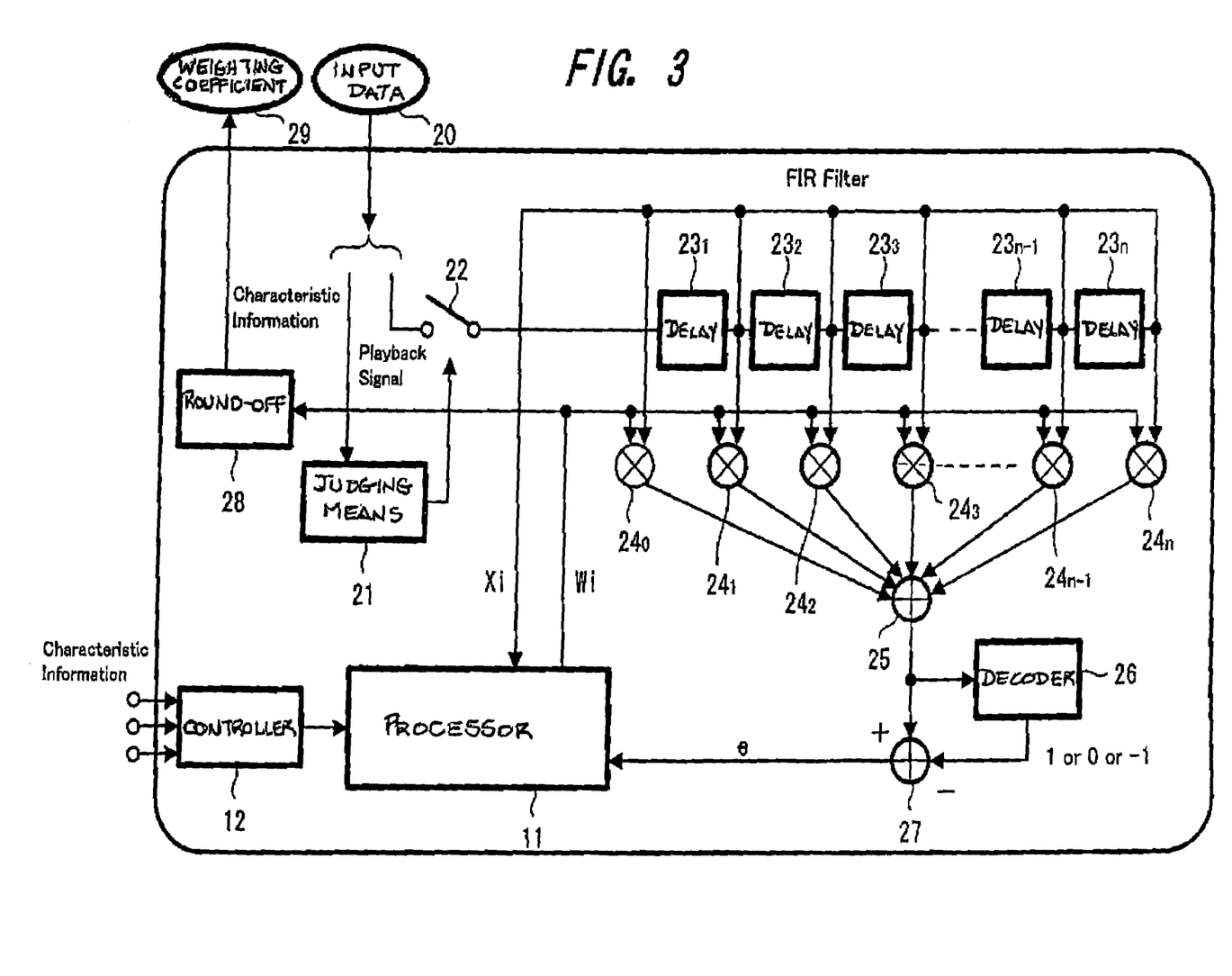
FIG. 3 is a structural diagram of one embodiment of an adaptive type equalization circuit to which the present invention is applied.

FIG. 3 shows the structure of the main portion of one embodiment of an adaptive type equalization circuit to which the present invention is applied. FIG. 3 only shows the relationship among the data generation circuit 10, the processor 11 and the controller 12 where the transversal filter 13 to which the weighting coefficients formed in those circuits are supplied and which performs an actual equalization processing is omitted since it is the same as that in FIG. 5 described above.

In FIG. 3, the characteristic information, for example, in input data 20 is supplied to means 21 which judges the effectiveness of a playback signal and a switch 22 through which the playback signal in the input data 20 passes is turned on only when the playback signal is effective. The playback signal passing through the switch 22 is supplied to unit delay means $23_1$ to $23_n$ having the same number of stages as that of the transversal filter 13. The signals from the input terminals and the output terminals of the unit delay means $23_1$ to $23_n$ are supplied to weighting means $24_0$ to $24_n$ respectively and further, the outputs of these weighting means $24_0$ to $24_n$ are summed in an adder 25.

The output of this adder 25 is supplied to a decoder 26 to be converted into a signal of a value "1", "0" or "−1" according to the level thereof. This converted signal is supplied to an adder 27 to be added to the output of the previous adder 25 and this added signal e is supplied to the processor 11. Further, a signal Xi of the input and output terminals of the unit delay means $23_1$ to $23_n$ is supplied to the processor 11. In this processor 11, [$\Delta Wi = -\mu \cdot e \cdot Xi$; where $\Delta Wi$ is an updated value of an internal coefficient and $\mu$ is a step size] is calculated.

Further, the updated value "$\Delta Wi$" of an internal coefficient calculated in the processor 11 is supplied to the weighting means $24_0$ to $24_n$ and employed for the adaptive processing of the next time. Thus, operation of the adaptive equalization processing by, for example, the LMS (Least Mean Square) algorithm is performed sequentially to update the internal coefficients one by one. The updated value of the internal coefficient, "$\Delta Wi$" is supplied to round-off process means 28 such that a weighting coefficient 29 for which a round-off process is performed in the round-off process means 28 is taken out. Actually in the present circuit, since bit number of calculation is greater than the weighting coefficient, the round-off process is performed.

In the present circuit, the number of playback signals to be operated is needed to be more than the number of stages of the unit delay means $23_1$ to $23_n$ and the number of updates of the internal coefficients is dependent on the number of time continuous playback signals that are inputted and the following equation is derived:

(the number of updates of the internal coefficients) ≥

(the number of continuous playback signals) −

(the number of stages of the unit delay means) + 1

After the internal coefficients are updated certain times, the round-off process for the internal coefficients is performed in consideration of the operation of the transversal filter 13 and the weighting coefficients are outputted.

In the present circuit, the control signal from the controller 12 is supplied to the processor 11. To this controller 12, for example, the information of the envelope value of the playback signal described above, the information showing that the playback signal is phase locked and the information of error detection of the playback signal are supplied. Based on these kinds of information, the controller 12 selects adaptive equalization programs that are executed in the processor 11, the selected adaptive equalization programs are loaded to the processor 11 and setting a parameter necessary for executing the adaptive equalization programs is performed.

Namely, a plurality of adaptive equalization programs are provided in the processor 11. Here the LMS algorithm described above is usually employed. Meanwhile in a case, for example, where a very fast convergence speed is required, an adaptive equalization program in which, for example, an affine projection algorithm, a block conjugate gradient algorithm or the like is made a nucleus can be selected other than the LMS algorithm described above. The adaptive equalization programs are selected in the controller 12 based on the information described above and the selected adaptive equalization programs are loaded to the processor 11 such that the weighting coefficients are operated.

Also in the LMS algorithm, although a fixed step size in which operation amount is small and the load of the processor is small is employed, in a case, for example, where there is a long spare time in the processor 11, a process in which the step size is shortened gradually from a longer step size is executed in order to expedite the convergence speed. Further, in a case, for example, where a head in which Barkhausen noise (discontinuous fluctuation in the output) occurs is employed and when the amplitude of a playback signal frequently fluctuates, it is possible to perform a process in which the step size is controlled in response to the amplitude.

Therefore, according to the present embodiment, plural adaptive equalization programs are selected by employing characteristic information related to an input signal and parameters necessary for executing the programs are set and therefore, when continuous noises frequently occur or a temporal decrease in the level of the playback signal or discontinuous fluctuation in the output occurs, an appropriate countermeasure can always be taken and an adaptive type equalization circuit can be adopted excellently even in a playback apparatus in which, for example, tracking control is not performed.

Thus, while an adaptive type equalization circuit could not be adopted in a conventional playback apparatus in which, for example, tracking control is not performed since there is a fear that erroneous weighting coefficients are formed in an adaptive type equalization circuit in a case, for example, where continuous noises frequently occurs and an appropriate countermeasure cannot be taken for a temporal deterioration in the level of a playback signal and for discontinuous fluctuation in the output, the present invention can easily solve these problems.

Figure 4:
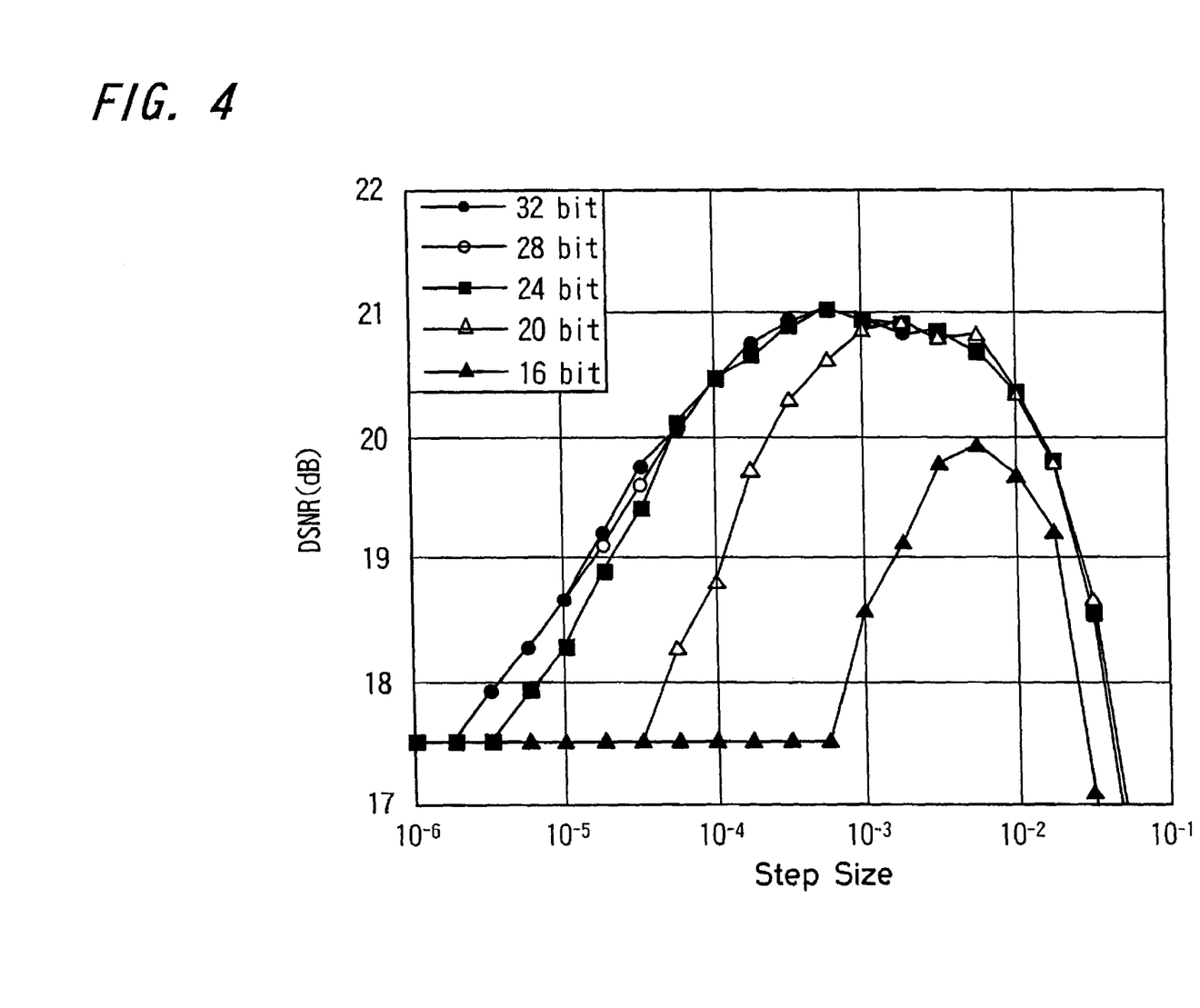
FIG. 4 is a graph for explaining FIG. 3.

Accordingly FIG. 4 shows simulation results how the characteristic as an adaptive type equalization circuit is changed when accuracy (bit length) of an internal coefficient in an adaptive equalization program is changed and when the step size (loop gain) is changed. Here in the simulation, a playback signal whose the digital signal to noise ratio (DSNR) is 17.5 dB immediately before it is inputted to the transversal filter 13 is used for obtaining DSNR of the output signal of the transversal filter 13 and FIG. 4 shows how that DSNR changes in response to the step size.

According to this FIG. 4, it is found with respect to the accuracy of an internal coefficient that the DSNR is drastically deteriorated when coefficient accuracy is set smaller than 24 bit length. With respect to the step size, the size is the gain at the time of updating an internal coefficient where the greater the step size, the greater the amount of update of an internal coefficient, and updating of an internal coefficient is not performed if the step size is too small and the DSNR is not improved. Conversely, when the step size is too large, the internal coefficient changes too much and does not converge so that the DSNR deteriorates. According to the simulation of FIG. 4, it becomes clear that approximately 0.001 of the step size is appropriate.

Thus, with the adaptive type equalization circuit described above which has a plurality of unit delay means delaying an input signal sequentially, a plurality of weighting means weighting these respective delayed signals and adding means adding these weighted signals wherein respective weighting coefficients of the plurality of weighting means are updated according to the input signal and which has a processor executing a plurality of adaptive equalization programs and a controller controlling the processor wherein the characteristic information related to the input signal is supplied to the controller to perform selection of the plurality of adaptive equalization programs and to perform setting of a parameter necessary for executing it, an appropriate countermeasure can always be taken and excellent equalization can always be performed even when continuous noises frequently occur or a temporal decrease in the level of a playback signal and discontinuous fluctuation in the output occur.

With the playback apparatus described above, since the playback apparatus which obtains a playback signal from a recording medium without performing tracking control comprises an adaptive type equalization circuit equalizing the playback signal, a processor executing a plurality of adaptive equalization programs and a controller controlling the processor wherein the characteristic information related to the playback signal is supplied to the controller to perform selection of the plurality of adaptive equalization programs and to perform setting of a parameter necessary for executing it, always an appropriate countermeasure can be taken, and an adaptive type equalization circuit can always be excellently adopted in a playback apparatus in which, for example, tracking control is not performed even when continuous noises frequently occur or a temporal decrease in the level of a playback signal and discontinuous fluctuation in the output occur.

Further, with the adaptive equalization method described above, since the adaptive equalization method which has a plurality of unit delay means delaying an input signal sequentially, a plurality of weighting means weighting these respective delayed signals and adding means adding these weighted signals wherein respective weighting coefficients of the plurality of weighting means are updated according to the input signal, selection of a plurality of adaptive equalization programs is performed and a parameter necessary for executing it is set based on the characteristic information related to the input signal, an appropriate countermeasure can always be taken and excellent equalization can always be performed even when continuous noises frequently occur or a temporal decrease in the level of a playback signal and discontinuous fluctuation in the output occur.

It should be noted the present invention is not limited to the embodiment explained above and various modifications can be adopted without departing from the spirit of the present invention.

In more detail, with the present invention, since selection of a plurality of adaptive equalization programs and setting of a parameter necessary for executing it are performed by employing characteristic information related to an input signal, an appropriate countermeasure can always be taken and excellent equalization can always be performed even when continuous noises frequently occur or a temporal decrease in the level of a playback signal or discontinuous fluctuation in the output occurs.

With the present invention, since the input signal which is time continuous and has a limited length whose length is greater than the number of stages of the unit delay means is supplied to the processor and the characteristic information related to the input signal is supplied to the controller, excellent equalization can be performed.

With the present invention, since the adaptive equalization programs are controlled by the input signal and the characteristic information related to the input signal and the weighting coefficients are calculated from the input signal by an adaptive equalization algorithm contained in the adaptive equalization program, always excellent equalization can be performed in response to the characteristic of the input signal.

With the present invention, by comprising detection means at least obtaining an envelope value of the input signal, phase lock loop means locking the input signal to a certain phase and error correction means correcting an error in the input signal wherein any one or more of information related to an envelope from the detection means at the time when the input signal is obtained, information related to a phase lock in the phase lock loop means and information of error correction in the error correction means is employed as the characteristic information related to the input signal, excellent equalization can be performed in response to the characteristic of the input signal.

Further, with the present invention, based on a fact that selection of the plurality of adaptive equalization programs and setting of a parameter necessary for executing it are performed by employing characteristic information related to the input signal, an appropriate countermeasure can always be taken and an adaptive type equalization circuit can be excellently adopted in a playback apparatus in which, for example, tracking control is not performed even when continuous noises frequently occur or a temporal decrease in the level of a playback signal or discontinuous fluctuation in the output occurs.

With the present invention, since an adaptive type equalization circuit has a plurality of unit delay means delaying a playback signal sequentially, a plurality of weighting means weighting these respective delayed signals and adding means adding these weighted signals, a processor executing a plurality of adaptive equalization programs and a controller controlling the processor wherein respective weighting coefficients of the plurality of weighting means are updated according to the playback signal and the characteristic information related to the playback signal is supplied to the controller to perform selection of the plurality of adaptive equalization programs and to perform setting of a parameter necessary for executing it, an appropriate countermeasure can always be taken, excellent equalization can always be performed and an adaptive type equalization circuit can be excellently adopted in a playback apparatus in which, for example, tracking control is not performed even when continuous noises frequently occur or a temporal deterioration in the level of a playback signal or discontinuous fluctuation in the output occurs.

With the present invention, since the playback signal which is time continuous and has a limited length whose length is greater than the number of stages of the unit delay means is supplied to the processor and the characteristic information related to the playback signal is supplied to the controller, excellent equalization can be performed, and an adaptive type equalization circuit can be excellently adopted in a playback apparatus in which, for example, tracking control is not performed.

With the present invention, since the adaptive equalization programs are controlled by the playback signal and the characteristic information related to the playback signal and the weighting coefficients are calculated from the playback signal by an adaptive equalization algorithm contained in the adaptive equalization program, always excellent equalization can be performed in response to the characteristic of the input signal and an adaptive type equalization circuit can be excellently adopted in a playback apparatus in which, for example, tracking control is not performed.

With the present invention, by comprising detection means at least obtaining an envelope value of the playback signal, phase lock loop means locking the playback signal to a certain phase and error correction means correcting an error in the playback signal wherein any one or more of information related to an envelope from the detection means at the time when the playback signal is obtained, information related to a phase lock in the phase lock loop means and information of error correction in the error correction means is employed as the characteristic information related to the playback signal, excellent equalization can be performed in response to the characteristic of the input signal and an adaptive type equalization circuit can be excellently adopted even in a playback apparatus in which, for example, tracking control is not performed.

Further, with the present invention, by means of performing selection of the plurality of adaptive equalization programs and by performing setting of a parameter necessary for executing it by employing characteristic information related to the input signal, an appropriate countermeasure can always be taken and excellent equalization can always be performed even when continuous noises frequently occur or a temporal decrease in the level of a playback signal or discontinuous fluctuation in the output occurs.

With the present invention, since the input signal is time continuous and has a limited length whose length is greater than the number of stages of the unit delay means, excellent equalization can be performed.

With the present invention, since the adaptive equalization programs are controlled by the input signal and the characteristic information related to the input signal and the weighting coefficients are calculated from the input signal by an adaptive equalization algorithm contained in the adaptive equalization program, excellent equalization can always be performed in response to the characteristic of the input signal.

With the present invention, by comprising detection means at least obtaining an envelope value of the input signal, phase lock loop means locking the input signal to a certain phase and error correction means correcting an error in the input signal wherein any one or more of information related to an envelope from the detection means at the time when the input signal is obtained, information related to a phase lock in the phase lock loop means and information of error correction in the error correction means is employed as the characteristic information related to the input signal, an appropriate countermeasure can always be taken and an adaptive type equalization circuit can be excellently adopted even in a playback apparatus in which, for example, tracking control is not performed even when continuous noises frequently occur or a temporal decrease in the level of a playback signal or discontinuous fluctuation in the output occurs.

In a conventional device, there is a fear that an erroneous coefficient of weighting is formed in an adaptive type equalization circuit, for example, in a case where continuous noises frequently occur and an appropriate countermeasure cannot be taken for a temporal decrease in the level of a playback signal or for discontinuous fluctuation in the output, and thus an adaptive type equalization circuit cannot be adopted in a playback apparatus in which, for example, tracking control is not performed, however, as mentioned above these problems can be easily solved according to the present invention.

| Description of Reference Numerals | |
|---|---|
| 1 | magnetic tape |
| 2 | playback head |
| 3 | playback amplifier |
| 4 | analog equalization circuit |
| 5 | automatic gain control circuit |
| 6 | analog to digital converter (ADC) |
| 7 | phase lock loop (PLL) means |
| 8 | detector of an envelope value |
| 9 | analog to digital converter (ADC) |
| 10 | data generation circuit |
| 11 | processor |
| 12 | controller |
| 13 | transversal filter |
| 14 | Viterbi decoder |
| 15 | error correction codes (ECC) demodulation circuit |
| 16 | digital to analog converter (DAC) |
| 17 | output terminal |
| 20 | input data |
| 21 | effectiveness judging means |
| 23 | unit delay means |
| 24 | weighting means |
| 25, 27 | adding means |
| 26 | decoder |
| 28 | round-off process means |
| 29 | weighting coefficients |

The invention claimed is:

1. An adaptive type equalization circuit having a plurality of unit delay means delaying an input signal sequentially, a plurality of weighting means weighting these respective delayed signals, and adding means adding these weighted signals, comprising:
a processor executing a plurality of adaptive equalization programs; and
a controller coupled to the processor to control the processor,
wherein respective weighting coefficients of the plurality of weighting means are updated by the processor according to the input signal, and
wherein the characteristic information related to said input signal is supplied to said controller to perform selection of one of said plurality of adaptive equalization programs and the characteristic information also sets a parameter necessary for executing the selected adaptive equalization program, and
wherein a step size of the processor is gradually shortened to expedite convergence speed based upon spare time in the processor, and
wherein the step size is controlled in response to fluctuations in the amplitude of the input signal.

2. An adaptive type equalization circuit according to claim 1, characterized in that the input signal which is time continuous and has a limited length whose length is greater than the number of stages of said unit delay means is supplied to said processor, and the characteristic information related to said input signal is supplied to said controller.

3. An adaptive type equalization circuit according to claim 1, characterized in that said adaptive equalization programs are controlled by said input signal and said characteristic information related to said input signal, and said weighting coefficients are calculated from said input signal by an adaptive equalization algorithm contained in said adaptive equalization program.

4. An adaptive type equalization circuit according to claim 1, further comprising detection means at least obtaining an envelope value of said input signal, phase lock loop means locking said input signal to a certain phase, and error correction means correcting an error in said input signal, wherein the characteristic information related to said input signal is any one or more, either alone or in combination, of information related to an envelope from said detection means at the time when the input signal is obtained, information related to a phase lock in said phase lock loop means and information of error correction in said error correction means.

5. A playback apparatus obtaining a playback signal from a recording medium without performing tracking control, characterized in that said playback apparatus comprises:
an adaptive type equalization circuit to equalize said playback signal, the adaptive type equalization circuit including:
a processor to execute a plurality of adaptive equalization programs, and
a controller coupled to the processor to control the processor,
wherein the characteristic information related to said playback signal is supplied to said controller to perform selection of one of said plurality of adaptive equalization programs and the characteristic information also sets a parameter necessary for executing the selected adaptive equalization program; and
wherein a step size of the processor is gradually shortened to expedite convergence speed based upon spare time in the processor, and
wherein the step size is controlled in response to fluctuations in the amplitude of the playback signal.

6. A playback apparatus according to claim 5, characterized in that said adaptive type equalization circuit further comprises a plurality of unit delay means delaying said playback signal sequentially, a plurality of weighting means weighting these respective delayed signals, adding means adding these weighted signals, wherein respective weighting coefficients of said plurality of weighting means are updated by the processor according to said playback signal and the characteristic information related to said playback signal is supplied to the controller to perform selection of one of the plurality of adaptive equalization programs and to perform setting of a parameter necessary for executing the selected adaptive equalization program.

7. A playback apparatus according to claim 6, characterized in that the playback signal which is time continuous and has a limited length whose length greater than the number of stages of said unit delay means is supplied to the processor and, the characteristic information related to said playback signal is supplied to said controller.

8. A playback apparatus according to claim 6, characterized in that said adaptive equalization programs are controlled by said playback signal and said characteristic information related to said playback signal, and said weighting coefficients are calculated from said playback signal by an adaptive equalization algorithm contained in said adaptive equalization program.

9. A playback apparatus according to claim 6, further comprising detection means at least obtaining an envelope value of said playback signal, phase lock loop means locking said playback signal to a certain phase, and error correction means correcting an error in said playback signal, wherein any one or more of information related to an envelope from said detection means at the time when said playback signal is obtained, information related to a phase lock in said phase lock loop means and information of error correction in said error correction means is employed as the characteristic information related to said playback signal.

10. An adaptive equalization method comprising:
delaying an input signal sequentially by a plurality of unit delay means;
selecting one of a plurality of adaptive equalization programs to determine respective weighting coefficients;
setting a parameter necessary for executing adaptive equalization based on characteristic information related to said input signal; and
weighting each of the delayed signals with a respective weighting coefficient; and
adding the weighted delayed signals,
wherein the characteristic information related to said input signal is supplied to said controller to perform selection of one of said plurality of adaptive equalization programs and the characteristic information also sets a parameter necessary for executing the selected adaptive equalization program, and
wherein a step size of the processor is gradually shortened to expedite convergence speed based upon spare time in the processor, and
wherein the step size is controlled in response to fluctuations in the amplitude of the input signal.

11. An adaptive equalization method according to claim 10, characterized in that the input signal is time continuous and has a limited length whose length is greater than the number of stages of said unit delay means.

12. An adaptive equalization method according to claim 10, characterized in that said adaptive equalization programs are controlled by said input signal and said characteristic information related to said input signal, and the weighting coefficients are calculated from said input signal by an adaptive equalization algorithm contained in said adaptive equalization program.

13. An adaptive equalization method according to claim 10, further comprising:
obtaining at least an envelope value of said input signal by a detection means;
locking said input signal to a certain phase by a phase lock loop means; and
correcting an error in said input signal by an error correction means,
wherein the characteristic information related to said input signal comprises any one or more, either alone or in combination, of information related to an envelope from said detection means at the time when said input signal is obtained, information related to a phase lock in said phase lock loop means and information of error correction in said error correction means.

14. The method of claim 1, wherein the adaptive equalization program is selected from the group consisting of (a least-means-squares algorithm, an affine projection algorithm, and a block conjugate gradient algorithm).

15. The method of claim 5, wherein the adaptive equalization program is selected from the group consisting of (a least-means-squares algorithm, an affine projection algorithm, and a block conjugate gradient algorithm).

16. The method of claim 10, wherein the adaptive equalization program is selected from the group consisting of (a least-means-squares algorithm, an affine projection algorithm, and a block conjugate gradient algorithm).

* * * * *